(12) United States Patent
Penny et al.

(10) Patent No.: US 11,804,406 B2
(45) Date of Patent: Oct. 31, 2023

(54) TOP VIA CUT FILL PROCESS FOR LINE EXTENSION REDUCTION

(71) Applicant: International Business Machines Corporation, Armonk, NY (US)

(72) Inventors: Christopher J. Penny, Saratoga Springs, NY (US); Brent Anderson, Jericho, VT (US); Lawrence A. Clevenger, Saratoga Springs, NY (US); Kisik Choi, Watervliet, NY (US); Nicholas Anthony Lanzillo, Wynantskill, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 17/383,637

(22) Filed: Jul. 23, 2021

(65) Prior Publication Data

US 2023/0024306 A1  Jan. 26, 2023

(51) Int. Cl.
*H01L 21/768* (2006.01)
*H01L 23/522* (2006.01)

(52) U.S. Cl.
CPC .... *H01L 21/76897* (2013.01); *H01L 21/7684* (2013.01); *H01L 21/76808* (2013.01); *H01L 21/76829* (2013.01); *H01L 21/76831* (2013.01); *H01L 21/76832* (2013.01); *H01L 23/5226* (2013.01)

(58) Field of Classification Search
CPC ......... H01L 21/76897; H01L 21/76808; H01L 21/7683; H01L 21/76832; H01L 21/7684; H01L 21/76834; H01L 21/76835; H01L 21/76838; H01L 21/76852; H01L 21/76892; H01L 21/76829; H01L 21/76843; H01L 21/76847; H01L 21/76807; H01L 23/5226; H01L 23/528
See application file for complete search history.

(56) References Cited

U.S. PATENT DOCUMENTS

| | | | |
|---|---|---|---|
| 5,693,568 A | 12/1997 | Liu | |
| 6,245,669 B1 | 6/2001 | Fu | |
| 6,291,334 B1 | 9/2001 | Somekh | |
| 6,424,044 B1 | 7/2002 | Han | |
| 8,611,055 B1 | 12/2013 | Pakala | |
| 9,263,325 B1 | 2/2016 | Wei | |
| 9,613,861 B2 | 4/2017 | Anderson | |
| 10,020,223 B1 | 7/2018 | Anderson | |
| 10,134,580 B1 * | 11/2018 | LiCausi | H01L 23/5329 |
| 10,242,907 B2 | 3/2019 | Ryckaert | |
| 10,347,506 B2 | 7/2019 | Fan | |
| 2021/0125865 A1 * | 4/2021 | Dutta | H01L 21/0335 |

* cited by examiner

*Primary Examiner* — Thanhha S Pham
(74) *Attorney, Agent, or Firm* — Michael A. Petrocelli

(57) ABSTRACT

An interconnect structure including a top via with a minimum line end extension comprises a cut filled with an etch stop material. The interconnect structure further comprises a line formed adjacent to the etch stop material. The interconnect structure further comprises a top via formed on the line adjacent to the etch stop material, wherein the top via utilizes the etch stop material to achieve minimum line extension.

9 Claims, 4 Drawing Sheets

TOP VIA CUT FILL PROCESS FOR LINE EXTENSION REDUCTION

BACKGROUND

The present invention relates generally to the fabrication of semiconductor devices, and more particularly to reducing line end extensions in the fabrication of interconnect line end vias.

A via is an electrical connection between layers in a physical electronic circuit that goes through the plane of one or more adjacent layers. In integrated circuit (IC) design, a via is a small opening in an insulating oxide layer that allows a conductive connection between different layers of horizontal interconnect wiring. A via on an integrated circuit that passes completely through a silicon wafer or die is called a through-chip via or through-silicon via. A via connecting the lowest layer of metal to diffusion or poly is typically called a "contact."

In a damascene process the dielectric is first deposited onto the substrate, which is then patterned and filled by metal deposition. The dual-damascene process is characterized by patterning the vias and trenches in such a way that the metal deposition fills both at the same time. In the dual damascene process, a low-k dielectric material is first deposited on the surface of the device. In an example of a dual damascene process, low-k films, which may be based on a carbon-doped oxide material, are used to insulate one part of the device from another. The next step is to pattern tiny vias and trenches in the dielectric material.

In a subtractive top via process a metal is first deposited onto the substrate, which is then etched and patterned using reactive ion etching (RIE) techniques. The lines and vias may be patterned at the same time. In addition, the vias are formed on top of the lines in a top via process. The next step after the formation of lines and vias is to deposit a dielectric material covering all of the lines and vias. A top via structure may also be formed by starting with a damascene line and then subtractively etching the metal, leaving only the via shape on top.

SUMMARY

Embodiments of the present invention include an interconnect structure including a top via with a minimum line end extension and a method of making the same. The interconnect structure comprises a cut filled with an etch stop material. The interconnect structure further comprises a line formed adjacent to the etch stop material. The interconnect structure further comprises a top via formed on the line adjacent to the etch stop material, wherein the top via utilizes the etch stop material to achieve minimum line extension.

The method of making the interconnect structure including a top via with a minimum line end extension includes forming a cut cavity in a layer of a first dielectric material on an interconnect structure, where the cut cavity forms a line cut. Next, a second dielectric material is deposited over the cut cavity to fill the line cut, where the filled line cut forms an etch stop. Next, a first portion of the first dielectric is removed to form one or more trenches. Next, the one or more trenches are filled with metal to form one or more lines. Lastly, a second portion of the metal is removed to form a top via, wherein the top via is formed using the etch stop to minimize a line end extension.

DETAILED DESCRIPTION

Figure 1A:
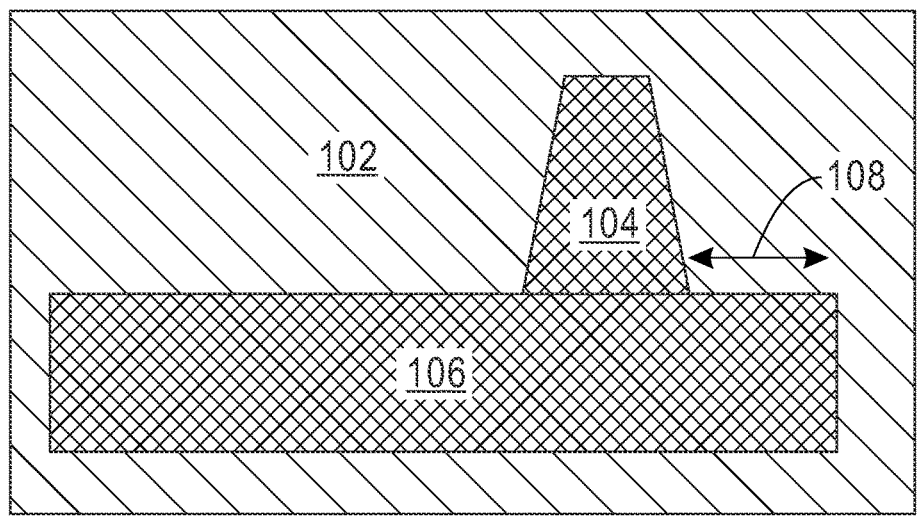
FIG. 1a depicts a cross-sectional view of an interconnect structure including a line end extension in the fabrication of a line end via in a semiconductor device.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps depicted can be combined as an integrated process step. In addition, descriptions of well-known functions and constructions may be omitted for clarity and conciseness.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Yielding traditional dual damascene vias is difficult at small dimensions due to the placement of the via below the trench. Implementation of a top-via structure can resolve this issue, but there are still potential limitations on placing vias at the line ends to achieve the required via density. Line end extension past a via is a significant limiting factor for unit cell scaling in advanced (beyond 5 nm) nodes. Having a finite, i.e., non-zero, line end extension takes up space (area), which is counterproductive when trying to shrink the size of components on a chip and increase the component density (Moore's law). Current damascene and cut solutions allow reductions in tip-to-tip spacing, but the solution does not extend to reducing line extensions past the via. These approaches are not all applicable to a top-via integration scheme. FIG. 1a below provides an illustration of the line end extension problem.

Embodiments of the present invention generally provide a new process of forming a line-end via with a zero line extension. Embodiments of the present invention utilize an embedded cut placement in conjunction with a top-via approach to achieve the minimum line end extension past the via. A cut-fill process is used to provide self-alignment for the via at line end, thus reducing the need for line end extensions past the via. Unlike current integration schemes, in the present invention the cut is embedded in the dielectric prior to trench formation to ensure the minimum required line end extension. By including the cut placement in the dielectric prior to trench etch, the present invention enables the minimum line-end extension requirements when combined with a top via integration scheme. Taper angles, ability to fill, and via critical dimension variation/placement are all alleviated with this scheme. The present invention could be used to either shrink the active area of the chip, or instead to increase the density of interconnects on a chip.

From a structural point of view, one of the key features of the present invention is that the dielectrics between adjacent lines are different. For example, if interconnect lines are running North/South, then the dielectric in the East/West direction is one material, e.g., dielectric A 110 from FIGS. 2-8. However, the dielectric in the "tip-to-tip" region separating interconnects is another material, e.g., dielectric B 115 (the cut material) from FIGS. 4-8.

FIG. 1a depicts a cross-sectional view of interconnect structure 100 including a line end extension in the fabrication of a line end via in a semiconductor device. Interconnect structure 100 includes dielectric 102, via 104, line 106 that connects to via 104, and line extension 108. It should be noted that although the sidewall angle of via 104 is illustrated at approximately 87-88 degrees, the actual sidewall angle may be 90 degrees in an ideal case, or any other angle as would be known to a person of skill in the art.

Figure 1B:
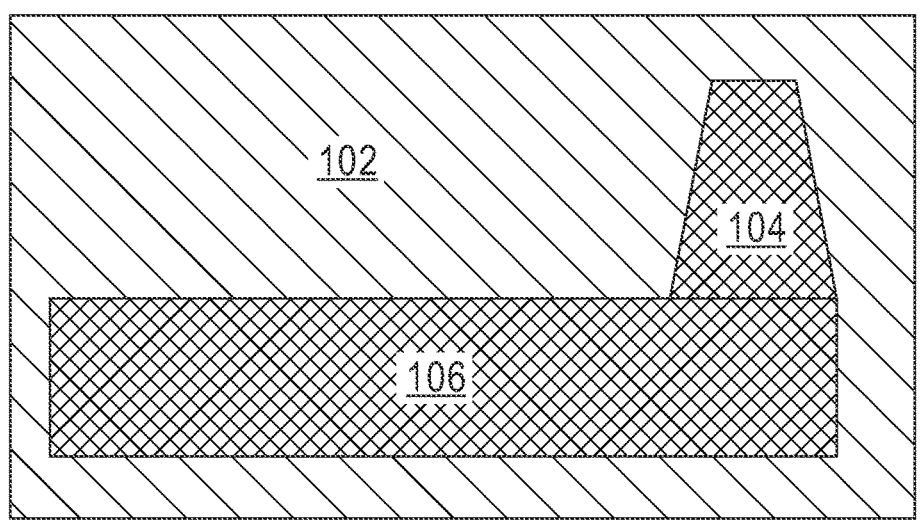
FIG. 1b depicts a cross-sectional view of an interconnect structure including a zero line end extension in the fabrication of a line end via in a semiconductor device, in accordance with an embodiment of the present invention.

FIG. 1b depicts a cross-sectional view of interconnect structure 100 including a zero line end extension in the fabrication of a line end via in a semiconductor device, in accordance with an embodiment of the present invention. Interconnect structure 100 includes dielectric 102, via 104, and line 106 that connects to via 104, as in FIG. 1a. In FIG. 1b, however, via 104 is formed at the very end of line 106, eliminating line end extension 108 from FIG. 1a. In addition, one of the major challenges in achieving zero-line-end extension is that the patterning of via 104 is subject to overlay and misalignment relative to line 106. Currently, in the event of misalignment, the via may not be formed at all. The present invention, however, is a method that enables zero line end extension even in the event of misalignment (due the presence of an embedded cut shape as illustrated in FIGS. 4-8 below as stop 114).

Figure 2:
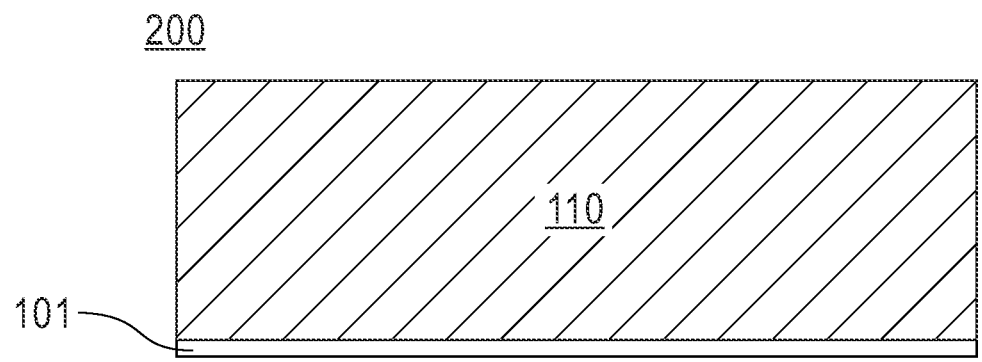
FIG. 2 depicts a cross-sectional view of the interconnect structure after fabrication steps depositing a first dielectric on a layer of a semiconductor.

FIG. 2 depicts a cross-sectional view of interconnect structure 200 after fabrication steps depositing an Interlayer Dielectric (ILD) on the exposed surface of interconnect structure 200. In various embodiments, a first dielectric, Dielectric A 110, is deposited on top of Substrate 101. In an embodiment, substrate 101 may be another metal level located directly below dielectric A 110. In another embodiment, substrate 101 may be the middle-of-line (MOL) metal layer, which includes the contacts connecting directly to the device region. In various embodiments, a typical back-end-of-line (BEOL) architecture can feature many metal levels, e.g., 14 levels, and interconnect structure 200 may be inserted into any or all of the multiple metal levels.

In various embodiments, dielectric A 110 is an industry standard low-k material. In an embodiment, dielectric A 110 is based on porous silicon dioxide ($SiO_2$). In another embodiment, dielectric A 110 is an ultra-low-k (ULK) dielectric. In an embodiment, the dielectric constant for dielectric A 110 may be 2.7. In yet another embodiment, any standard low-k or ULK dielectric material may be used for dielectric A 110 as would be known to a person of skill in the art.

Figure 3:
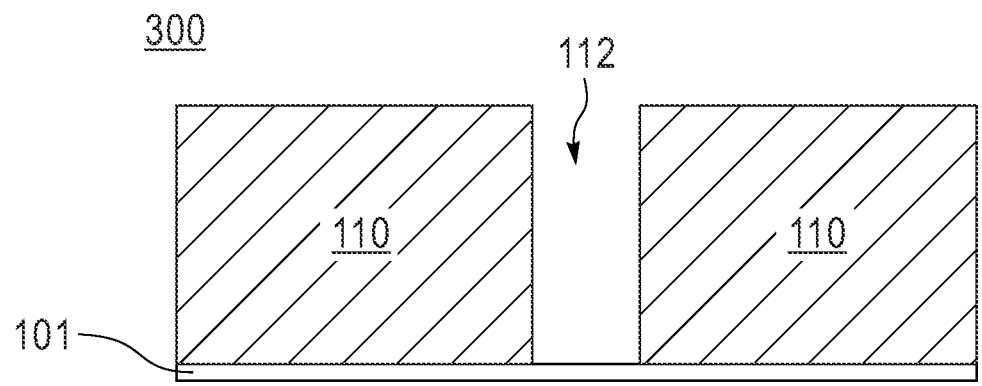
FIG. 3 depicts a cross-sectional view of the interconnect structure after fabrication steps forming at least one opening, in accordance with an embodiment of the present invention.

FIG. 3 depicts a cross-sectional view of interconnect structure 300 after fabrication steps to mask and etch the exposed surface of dielectric A 110 on interconnect structure 300, in accordance with an embodiment of the present invention. In various embodiments, a selective etch process is used to remove dielectric A 110 from the exposed surface of interconnect structure 300 forming at least one trench in dielectric A 110. In an embodiment, the selective etch process may use extreme ultraviolet lithography (EUV) patterning for metal pitch that is 30 nm or less. In the structure of FIG. 3 at least one opening, Cut 112, has been formed that will be filled with the stop material to provide self-alignment for the via at line end. In an embodiment, cut 112 is formed directly in dielectric 110 to be used later as a line cut. In an embodiment, interconnect structure 300 includes substrate 101.

Figure 4:
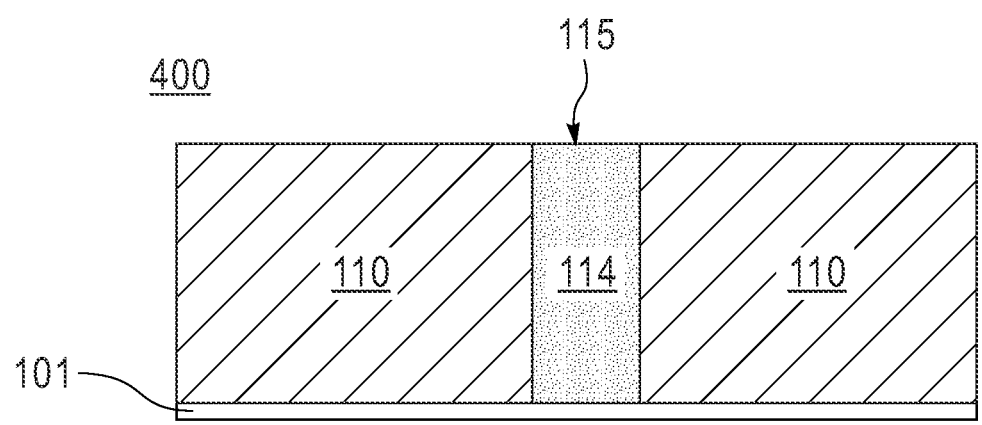
FIG. 4 depicts a cross-sectional view of the interconnect structure after fabrication steps forming a second dielectric, in accordance with an embodiment of the present invention.

FIG. 4 depicts a cross-sectional view of interconnect structure 400 after fabrication steps depositing a second dielectric on the exposed surface of interconnect structure 400 to fill cut 112, in accordance with an embodiment of the present invention. In various embodiments, a second dielectric, Dielectric B 115, has been deposited on interconnect structure 400 to fill in cut 112 to create Stop 114.

In an embodiment, the second dielectric material that is used to form stop 114, i.e., dielectric B 115, must be different than the material of dielectric A 110 to allow for selective etching of dielectric A 110. In an embodiment, the second dielectric material in stop 114 may be an aluminum oxide (AlOx), e.g., $Al_2O_3$, hafnium(IV) oxide (HfOx), zirconium oxide (ZrOx), silicon nitride (SiN), or similar etch stop material. In an embodiment, the second dielectric material is any standard dielectric as would be known to a person of skill in the art. In an embodiment, interconnect structure 400 includes substrate 101.

In various embodiments, after depositing the second dielectric material, the surface is planarized using, for example, chemical mechanical polishing.

Figure 5:
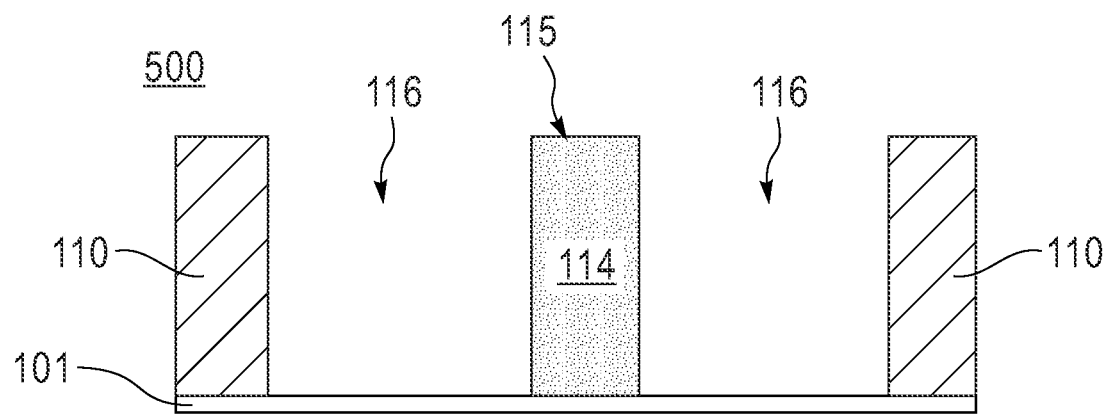
FIG. 5 depicts a cross-sectional view of the interconnect structure after fabrication steps etching at least one opening on each side of a stop, in accordance with an embodiment of the present invention.

FIG. 5 depicts a cross-sectional view of interconnect structure 500 after fabrication steps to mask and etch the exposed surface of dielectric A 110 on interconnect structure 500, in accordance with an embodiment of the present invention. In various embodiments, the exposed surface of dielectric A 110 on interconnect structure 500 is etched to create at least one opening on each side of stop 114. In the structure of FIG. 5, at least one trench 116 has been formed on each side of stop 114 by selectively etching dielectric A 110. In an embodiment, the material of dielectric A 110 must be different than the material of the second dielectric material of stop 114 to allow for this selective etching of trench 116 while leaving stop 114 in place. In an embodiment, interconnect structure 500 includes substrate 101.

Figure 6:
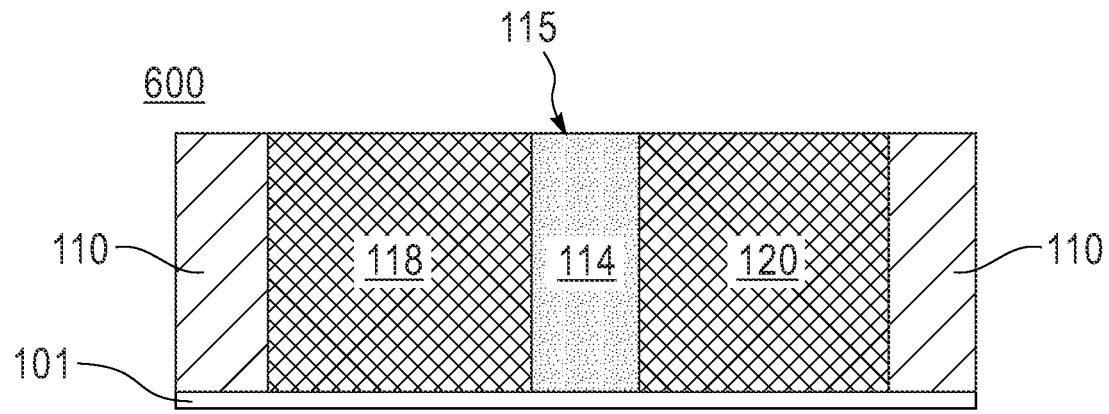
FIG. 6 depicts a cross-sectional view of the interconnect structure after fabrication steps depositing metal on exposed surfaces of the interconnect structure, in accordance with an embodiment of the invention.

FIG. 6 depicts a cross-sectional view of interconnect structure 600 after fabrication deposit a layer of metal on the exposed surface of interconnect structure 600, in accordance with an embodiment of the invention. In the structure of FIG. 6, interconnect structure 600 has been metallized to fill the at least one trench 116 on each side of stop 114 to form two lines, Line 1 118 and Line 2 120, and a via for connection to either line 1 118, line 2 120, or vias for both lines. In various embodiments, the metal may be, but is not limited to, copper (Cu), cobalt (Co), ruthenium (Ru), molybdenum (Mo), iridium (Jr), or rhodium (Rh). In an embodiment, the via(s) will be etched from the metal deposited in this step in FIG. 8. In an embodiment, interconnect structure 600 includes substrate 101.

In an embodiment, after metallization, the surface is polished using, for example, chemical mechanical polishing, to remove the excess metal for surface planarization and definition of the metal interconnect pattern.

Figure 7:
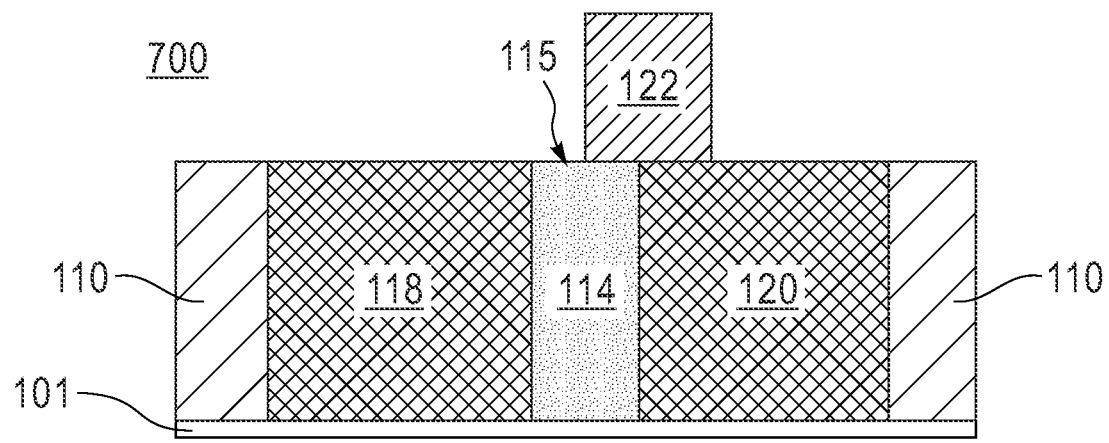
FIG. 7 depicts a cross-sectional view of the interconnect structure after fabrication steps to pattern the structure to create a via, in accordance with an embodiment of the present invention.

FIG. 7 depicts a cross-sectional view of interconnect structure 700 after fabrication steps to pattern interconnect structure 700 to create a via, in accordance with an embodiment of the present invention. In various embodiments, the structure of FIG. 7, Mask 122 is patterned onto interconnect structure 700. Mask 122 is used in FIG. 8 below for etching line 2 120 to create a via in line 2 120. In an embodiment, mask 122 is formed directly at the line end. In an embodiment, interconnect structure 700 includes substrate 101.

In the structure of FIG. 7, mask 122 is illustrated as misaligned over line 2 120 to demonstrate that the process disclosed in the present invention will form a zero line extension for a top via even if mask 122 is misaligned. As can be seen in FIG. 7, although mask 122 is misaligned with respect to line 2 120, stop 114 will prevent the via from being misaligned with respect to line 2 120, since dielectric B 115 that formed stop 114 will not etch when the metal of line 2 120 is etched to form the via.

Figure 8:
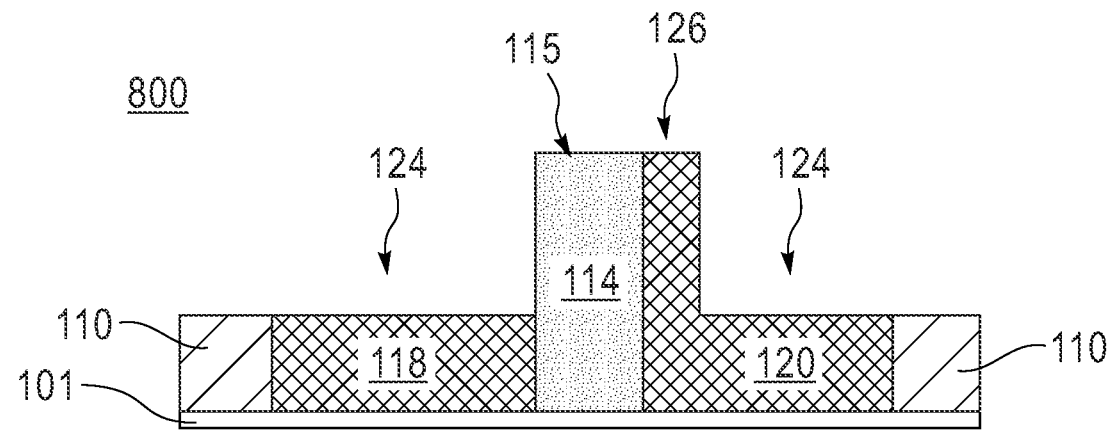
FIG. 8 depicts a cross-sectional view of the interconnect structure after fabrication steps of selective etching, in accordance with an embodiment of the present invention.

FIG. 8 depicts a cross-sectional view of interconnect structure 800 after fabrication steps to selective etch the exposed surface of interconnect structure 800, in accordance with an embodiment of the present invention. In the structure of FIG. 8, at least one opening 124 has been formed on either side of stop 114 and mask 122 by selectively etching the metal of line 1 118 and line 2 120 along with dielectric A 110 to finalize line 1 118 and line 2 120, and form via 126. In various embodiments, via 126 is formed using a subtractive process. In various embodiments, the second dielectric material of stop 114, i.e., dielectric B 115, was chosen specifically to prevent etching stop 114 in this step. Therefore, as can be observed in the cross-sectional view of FIG. 8, stop 114 forces the alignment of via 126 with the end of line 2 120. In an embodiment, interconnect structure 800 includes substrate 101.

Figure 9A:
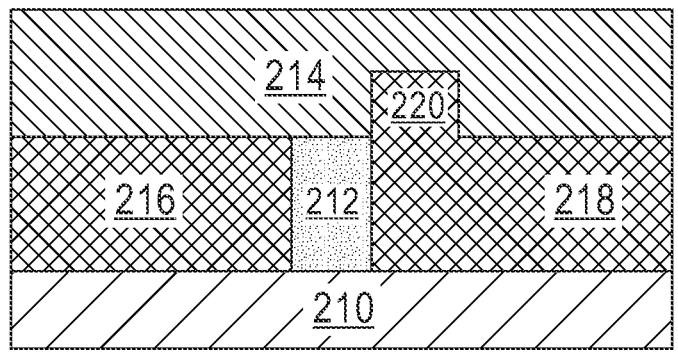
FIG. 9a depicts a cross-sectional view of an interconnect structure of a semiconductor device using the present invention.

FIG. 9a depicts a cross-sectional view of structure 900 of a semiconductor device using the present invention. FIG. 9a includes Dielectric A 210, e.g., dielectric A 110 from FIGS. 2-8, Stop 212, e.g., stop 114 from FIGS. 4-8, Dielectric C 214, Line 1 216 and Line 2 218, e.g., line 1 118 and line 2 120 from FIGS. 6-8, and Via 220, e.g., via 126 from FIG. 8. In an embodiment, dielectric C 214 may be the same material as dielectric A 210.

Figure 9B:
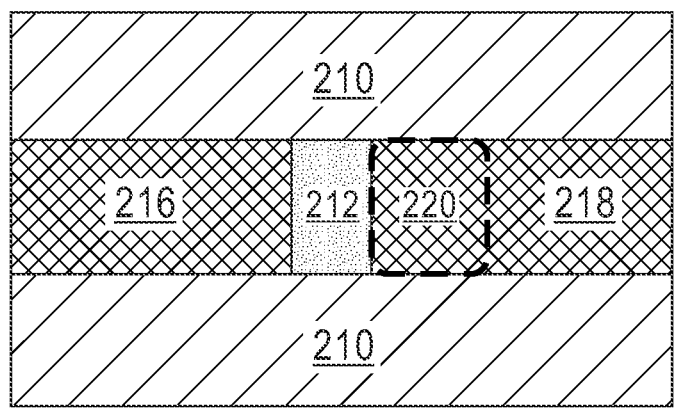
FIG. 9b depicts a top view of the interconnect structure of a semiconductor device using the present invention.

FIG. 9b depicts a top view of structure 900 of a semiconductor device using the present invention. FIG. 9b includes dielectric A 210, stop 212, line 1 216 and line 2 218, and via 220 from FIG. 9a. It should be noted that for illustrative purposes in the view of FIG. 9b dielectric C 214 has been stripped out and an outline has been drawn around via 220. Since via 220 and line 2 218 are formed from the same metallization, the actual separation of via 220 would not be visible from line 2 218 on an actual top view even with dielectric C 214 removed.

What is claimed is:
1. An interconnect structure comprising:
an etch stop region disposed above a substrate;
a first line adjacent to a first side of the etch stop region, the first line being located above the substrate, wherein a top surface of the first line is coplanar with a top surface of the etch stop region;

a second line adjacent to a second side of the etch stop region opposing the first side, the second line being located above the substrate, wherein a top surface of the second line is coplanar with the top surface of the etch stop region; and a top via extending from the second line, the top via protruding within a dielectric region disposed above the first line, the etch stop region and the second line, wherein the etch stop region allows the top via to achieve minimum line extension.

2. The interconnect structure of claim 1, wherein the etch stop region is formed in a first dielectric and the etch stop region comprises an etch stop material including a second dielectric different from the first dielectric.

3. The interconnect structure of claim 2, wherein the first dielectric is an ultra-low dielectric constant (ULK) material.

4. The interconnect structure of claim 2, wherein the first dielectric has a dielectric constant of 2.7.

5. The interconnect structure of claim 2, wherein the second dielectric is selected such that the first dielectric can be etched while the second dielectric remains unetched.

6. The interconnect structure of claim 2, wherein the etch stop material is chosen from a group comprising aluminum oxide, hafnium oxide, zirconium oxide, and silicon nitride.

7. The interconnect structure of claim 1, wherein the top via is formed subtractively, and further wherein the top via is formed at a line end using the etch stop region to achieve the minimum line extension.

8. The interconnect structure of claim 2, wherein the first line is located between the etch stop region and a first portion of the first dielectric and the second line is located between the etch stop region and a second portion of the first dielectric disposed on an opposite side of the first portion.

9. The interconnect structure of claim 1, wherein the top via protruding within the dielectric region comprises an uppermost surface of the top via being higher than the top surface of the etch stop region.

* * * * *